United States Patent [19]
Takada

[11] Patent Number: 5,416,742
[45] Date of Patent: May 16, 1995

[54] DYNAMIC RANDOM ACCESS MEMORY DEVICE HAVING SENSE AMPLIFIER CIRCUIT ARRAYS SEQUENTIALLY ACTIVATED

[75] Inventor: Masahide Takada, Tokyo, Japan

[73] Assignee: NEC Corporation, Tokyo, Japan

[21] Appl. No.: 43,996

[22] Filed: Apr. 7, 1993

Related U.S. Application Data

[63] Continuation of Ser. No. 866,476, Apr. 10, 1992, abandoned.

[30] Foreign Application Priority Data

Apr. 15, 1991 [JP] Japan .................... 3-082171

[51] Int. Cl.$^6$ ............................. G11C 11/401
[52] U.S. Cl. ..................... 365/203; 365/190;
365/204; 365/205; 365/208; 365/189.11;
365/230.04
[58] Field of Search ............... 365/205, 207, 208, 190,
365/230.04, 203, 189.11, 204

[56] References Cited

U.S. PATENT DOCUMENTS 4,791,616 12/1988 Taguchi et al. .............. 365/205
4,954,987 9/1990 Auvinen et al. ............... 365/230.04
5,053,998 10/1991 Kannan et al. ................. 365/208

FOREIGN PATENT DOCUMENTS 0238228 9/1987 European Pat. Off. .
62-150590 7/1987 Japan .

OTHER PUBLICATIONS

Patent Abstracts of Japan, vol. 011, No. 386 (P-647), Dec. 17, 1987 (JP-A∝62 150 590).

Primary Examiner—Joseph E. Clawson, Jr.
Attorney, Agent, or Firm—Sughrue, Mion, Zinn, Macpeak & Seas

[57] ABSTRACT

A dynamic random access memory device is equipped with sense amplifier circuits for developing differential voltage levels on associated bit line pairs, and the sense amplifier circuits are coupled through a discharging path with a ground voltage line, wherein the discharging path is implemented by a plurality of discharging sub-paths sequentially grounded by a control circuit so that the differential voltage levels are rapidly developed by smooth voltage decay on the associated discharging sub-paths, thereby improving the data access time.

4 Claims, 5 Drawing Sheets

DYNAMIC RANDOM ACCESS MEMORY DEVICE HAVING SENSE AMPLIFIER CIRCUIT ARRAYS SEQUENTIALLY ACTIVATED

This is a continuation of application Ser. No. 07/866,476, filed Apr. 10, 1992, now abandoned.

FIELD OF THE INVENTION

This invention relates to a dynamic random access memory device and, more particularly, to sense amplifier circuit arrays incorporated in the dynamic random access memory device.

DESCRIPTION OF THE RELATED ART

A typical example of the dynamic random access memory device implemented by MIS transistors is disclosed in "High-Density One-Device Dynamic MOS Memory Cells", IEEE Proceedings, vol. 130, June 1983, pages 127 to 135. FIG. 1 shows the dynamic random access memory device disclosed in the above mentioned IEEE Proceedings, and comprises a memory cell array 1. The memory cell array 1 is fabricated from a plurality of memory cells M11, M12, M21 and M22 arranged in rows and columns, and each of the memory cells M11 to M22 is implemented by a series combination of an n-channel type switching transistor Qn1 and a storage capacitor CP1.

A plurality of first bit lines BLa1 and BLa2 are respectively coupled with the memory cells M21 and M22, and second bit lines BLb1 and BLb2 are coupled with the memory cells M11 and M12, respectively. The first bit lines BLa1 and BLa2 are respectively paired with the second bit lines BLb1 and BLb2 so that bit line pairs BLP1 and BLP2 are respectively associated with the columns of the memory cells M11 to M22.

A plurality of word lines W1 and W2 are coupled to the gate electrodes of the n-channel type switching transistors Qn1 of the respective rows, and the word lines W1 to W2 are selectively driven to an active high voltage level. Namely, row address bits are decoded by a row address decoder 2, and one of the selecting signal lines X1 and X2 goes up to a high voltage level. A plurality of n-channel switching transistors Qn2 form in combination a word line driver 3, and the row address decoder 2 allows one of the n-channel switching transistors Qn2 to turn on so as to couple an activation signal line ACT1 with the associated word line. While the activation signal line ACT1 is elevated to the active high voltage level, the row address decoder 2 drives one of the selecting signal lines X1 and X2, and the active high voltage level is propagated to the associated word line. Then, the storage capacitors CP1 of the memory cells are coupled through the n-channel enhancement switching transistors Qn1 with the associated first or second bit lines BLa1 to BLa2 or BLb1 to BLb2, and data bits are transferred between the storage capacitors CP1 and the first or second bit lines BLa1 to BLa2 or BLb1 to BLb2.

The bit line pairs BLP1 to BLP2 are respectively coupled with sense amplifier circuits SA1 to SA2, and each of the sense amplifier circuits SA1 and SA2 comprises a series combination of two n-channel enhancement type amplifying transistors Qn3 coupled between the associated bit line pair BLP1 or BLP2. The gate electrode of one of the n-channel amplifying transistors Qn3 is coupled with the source node of the other of the n-channel amplifying transistors Qn3, and the common drain node N1 is coupled with a discharging line 4. The discharging line 4 is coupled with a control circuit 5 implemented by an n-channel enhancement type switching transistor Qn4, and the n-channel enhancement type switching transistor Qn4 is responsive to an activation signal ACT2 for coupling the discharging line 4 with a ground voltage line GND. A data bit is provided in the form of differential voltage level between the first bit line and the second bit line paired with each other, and the differential voltage level is developed by the associated sense amplifier circuit. Namely, if the discharging line 4 is grounded through the n-channel enhancement type switching transistor Qn4, the pairs of n-channel enhancement type amplifying transistors Qn3 vary the respective channel conductances depending upon the voltage level on the associated bit line, and, accordingly, the differential voltage levels are increased in magnitude.

The bit line pairs BLP1 and BLP2 are further coupled with pull-up circuits 6a and 6b, and each of the pull-up circuits 6a and 6b elevates one of the first and second bit lines to a predetermined restore level upon application of a pull-up signal P. The bit line pairs BLP1 and BLP2 are terminated at an input and output circuit 7, and the input and output circuit 7 interconnects one of the bit line pairs BLP1 and BLP2 and a data line pair 8 under the control of a column address decoder 9. Namely, the column address decoder 9 decodes column address bits, and instructs the input and output circuit 7 to provide a data path between one of the bit line pairs BLP1 and BLP2 designated by the column address bits and the data line pair 8. The data line pair 8 propagates one of the data bits in the form of differential voltage level to an input/output buffer unit (not shown), and the input/output buffer unit produces an output data signal indicative of the data bit read out from the memory cell designated by the row and column address bits.

FIG. 2 illustrates circuit behavior of the prior art dynamic random access memory device on the assumption that a data bit of logic "1" level stored in the memory cell M11 is accessed. The row address bits indicative of the word line W1 are decoded by the row address decoder 2, and the row address decoder 2 drives the selecting signal line X1 to the high voltage level. The selecting signal line X1 allows the associated n-channel enhancement type switching transistor Qn2 to turn on, and the word line W1 is elevated to the active high voltage level in synchronism with elevation of the activation signal line ACT1 at time t1. The n-channel enhancement type switching transistors Qn1 of the memory cells M11 and M12 turn on, and data bits stored in the respective storage capacitors CP1 are read out to the associated bit line pairs BLP1 and BLP2. Small differential voltage levels take place on the bit line pairs BLP1 and BLP2. Since the data bit of logic "1" level is stored in the memory cell M11, the second bit line BLb1 is slightly lifted, and an intermediate voltage generator (not shown) maintains the first bit line BLa1 in an intermediate voltage level between high and low voltage levels respectively corresponding to the data bit of logic "1" and a data bit of logic "0" level.

If the activation signal ACT2 goes up to the high voltage level at time t2, the n-channel enhancement type switching transistor Qn4 turns on so that the discharging line 4 is grounded through the n-channel enhancement type switching transistor Qn4. Then, all of the sense amplifier circuits SA1 and SA2 are concurrently activated, and a large amount of current flows from the bit lines of the intermediate voltage level through the sense amplifier circuits SA1 and SA2 to the discharging line 4. For this reason, the discharging line 4 is gradually decayed toward the ground voltage level, and reaches the ground voltage level at time t3. Then, the column address decoder 9 decodes the column address bits indicative of the bit line pair BLP1, and the input and output circuit 7 couples the bit line pair BLP1 with the data line pair 8. Then, large differential voltage level takes place on the data line pair 8.

At time t4, the pull-up signal P goes up to the active high voltage level, and, accordingly, activates the pull-up circuits 6a and 6b. The pull-up circuits 6a and 6b lift the bit lines higher than the other bit lines to the predetermined restore voltage level. For example, the pull-up circuit 6a lifts the second bit line BLb1 to the predetermined restore voltage level, and the predetermined restore voltage level is restored in the storage capacitor CP1 of the memory cell M11 as the data bit of logic "1" level.

However, a problem is encountered in the prior art dynamic random access memory device in data access speed. Namely, all of the sense amplifier circuits SA1 and SA2 are simultaneously activated, and a large amount of current flows from all of the bit line pairs BLP1 to BLP2 into the discharging line 4. This results in that the voltage level on the discharging line 4 is gradually decayed toward the ground voltage line, and term between time t2 and time t3 is prolonged.

SUMMARY OF THE INVENTION

It is therefore an important object of the present invention to provide a dynamic random access memory device which is improved in data access speed.

To accomplish these objects, the present invention proposes to sequentially activate sense amplifier circuits.

In accordance with the present invention, there is provided a dynamic random access memory device fabricated on a single semiconductor chip, comprising: a) a memory cell array implemented by a plurality of memory cells respectively storing a plurality of data bits in the form of electric charges; b) a plurality of bit line pairs associated with the memory cell array, and propagating data bits in the form of differential voltage level; c) a plurality of word lines selectively driven to an active level for allowing data bits to be transferred between the plurality of bit line pairs and memory cells selected from the plurality of memory cells; d) a plurality of sense amplifier circuits respectively coupled with the plurality of bit line pairs, and operative to develop the data bits in the form of differential voltage level on the associated bit line pairs upon activation thereof; and e) an activation means provided in association with the plurality of sense amplifier circuits, and operative to respectively activate the plurality of sense amplifier circuits by coupling the plurality of sense amplifier circuits with a constant voltage source.

BRIEF DESCRIPTION OF THE DRAWINGS

The features and advantages of the dynamic random access memory device according to the present invention will be more clearly understood from the following description taken in conjunction with the accompanying drawings in which.

DESCRIPTION OF THE PREFERRED EMBODIMENTS

First Embodiment

Figure 1:
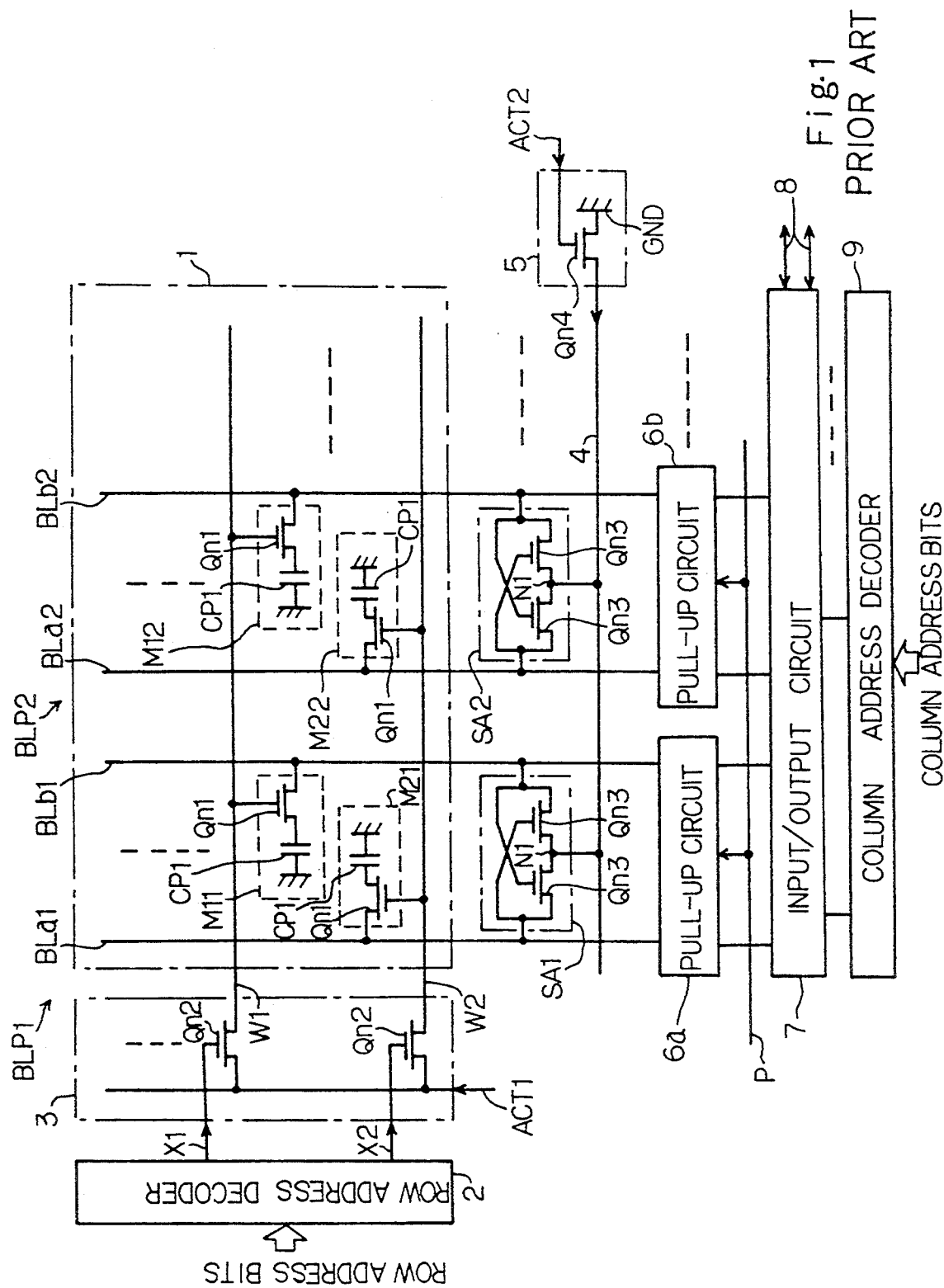
FIG. 1 is a block diagram showing the arrangement of the prior art dynamic random access memory device.
Figure 2:
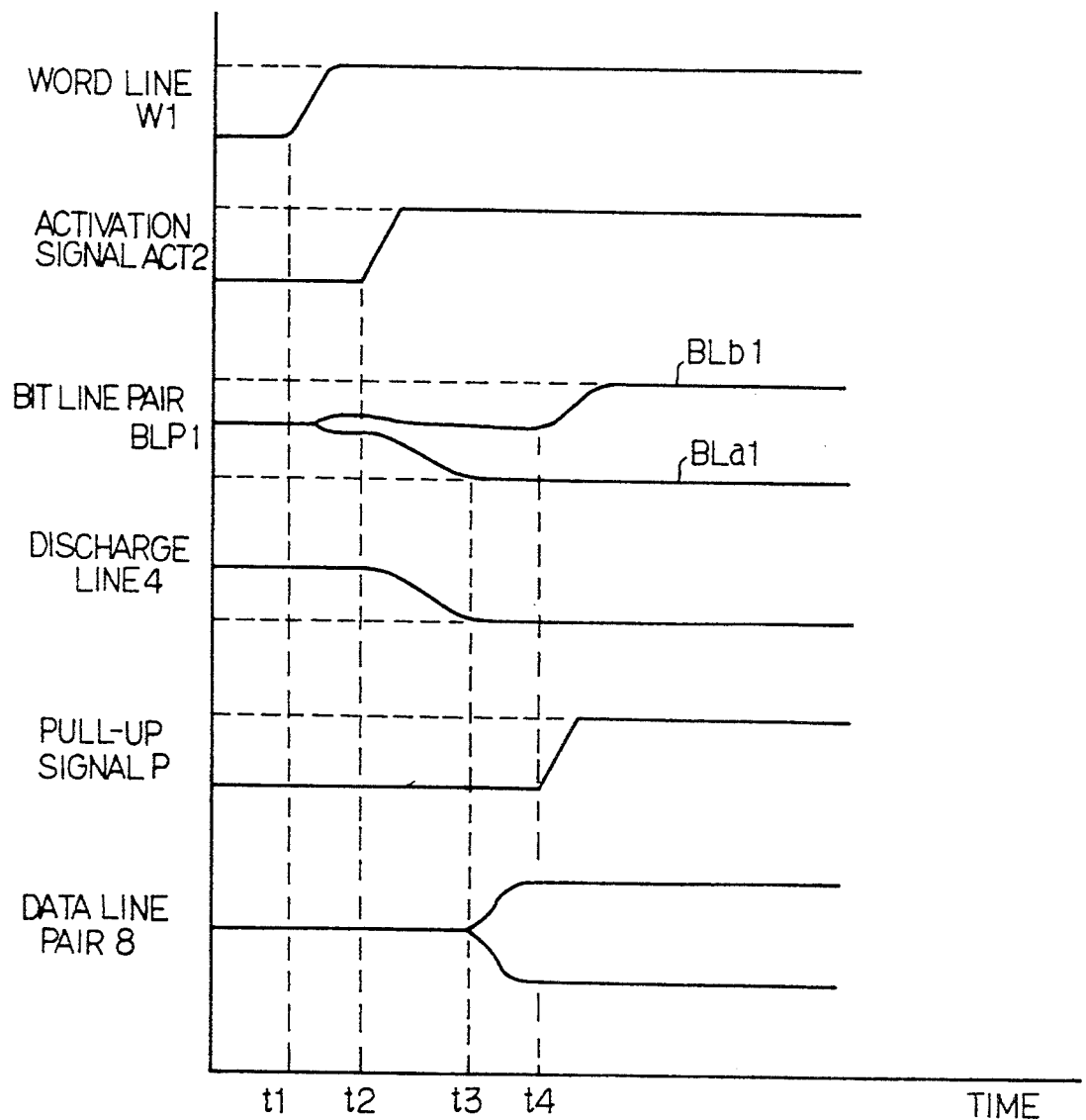
FIG. 2 is a diagram showing the waveforms of essential signals produced in the prior art dynamic random access memory device.
Figure 3:
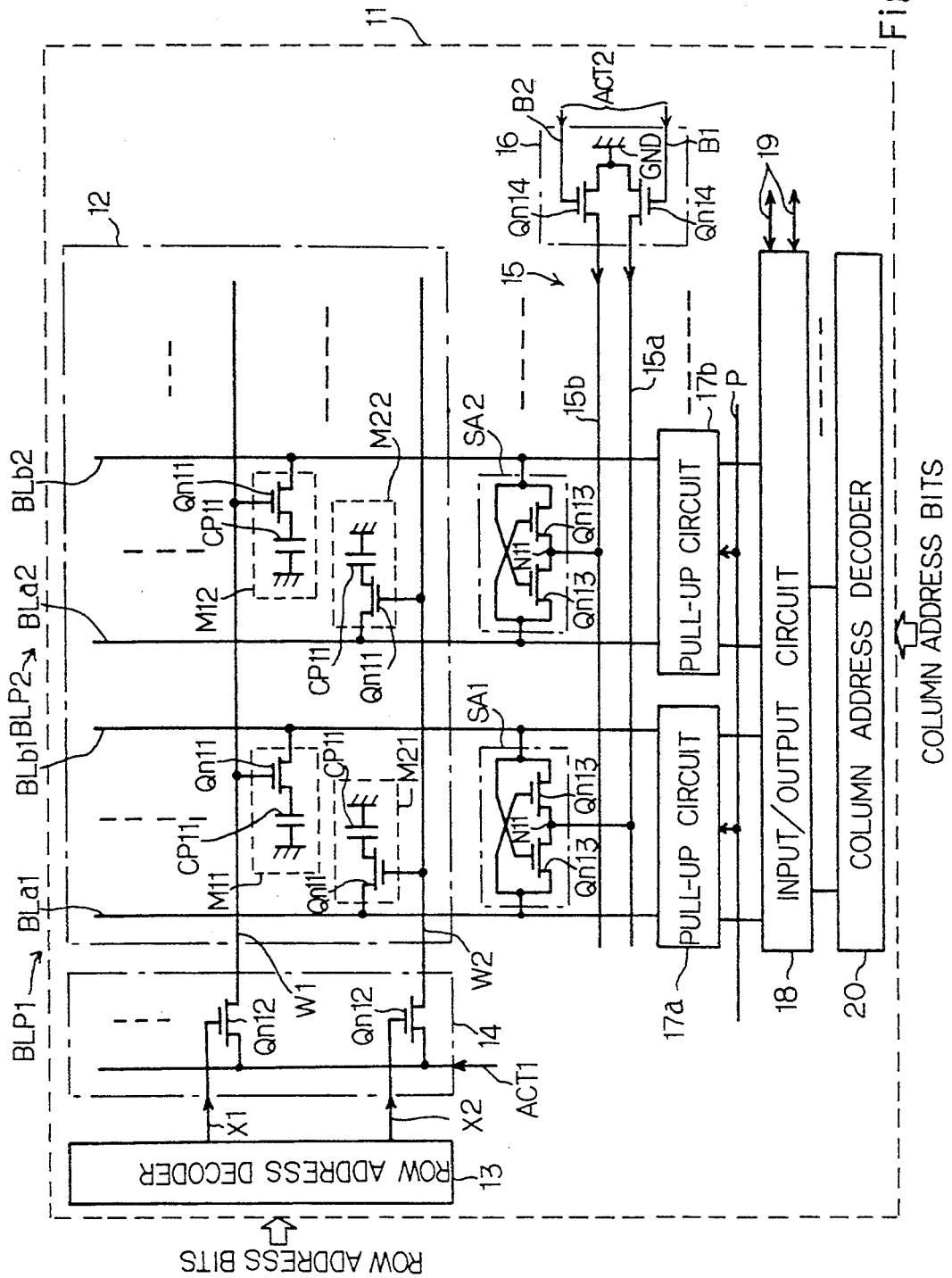
FIG. 3 is block diagram showing the arrangement of a dynamic random access memory device according to the present invention.

Referring to FIG. 3 of the drawings, a dynamic random access memory device is fabricated on a single semiconductor chip 11, and comprises a memory cell array 12. The memory cell array 12 is fabricated from a plurality of memory cells M11, M12, M21 and M22 arranged in rows and columns, and each of the memory cells M11 to M22 is implemented by a series combination of an n-channel type switching transistor Qn11 and a storage capacitor CP11.

First bit lines BLa1 and BLa2 are respectively coupled with the memory cells M21 and M22, and second bit lines BLb1 and BLb2 are coupled with the memory cells M11 and M12, respectively. The first bit lines BLa1 and BLa2 are respectively paired with the second bit lines BLb1 and BLb2 so that bit line pairs BLP1 and BLP2 are respectively associated with the columns of the memory cells M11 to M22.

A plurality of word lines W1 and W2 are coupled to the gate electrodes of the n-channel type switching transistors Qn11 of the respective rows, and the word lines W1 to W2 are selectively driven to an active high voltage level. Namely, row address bits are decoded by a row address decoder 13, and one of the selecting signal lines X1 and X2 goes up to a high voltage level. A plurality of n-channel switching transistors Qn12 form in combination a word line driver 14, and the row address decoder 13 allows one of the n-channel switching transistors Qn12 to turn on so as to couple an activation signal line ACT1 with the associated word line. While the row address decoder 13 drives one of the selecting signal lines X1 and X2, the activation signal line ACT1 is elevated to the active high voltage level, and the active high voltage level is propagated to the associated word line. Then, the storage capacitors CP1 of the memory cells associated with the word line driven to the active high voltage level are coupled through the n-channel enhancement switching transistors Qn11 with the associated first or second bit lines BLa1 to BLa2 or BLb1 to BLb2, and data bits are transferred between the storage capacitors CP1 and the first or second bit lines BLa1 to BLa2 or BLb1 to BLb2.

The bit line pairs BLP1 to BLP2 are respectively coupled with sense amplifier circuits SA1 to SA2, and each of the sense amplifier circuits SA1 and SA2 comprises a series combination of two n-channel enhancement type amplifying transistors Qn13 coupled between the first and second bit lines of the associated bit line pair BLP1 or BLP2. The gate electrode of one of the n-channel amplifying transistors Qn13 is coupled with the source node of the other of the n-channel amplifying transistors Qn13, and the common drain node N11 is coupled with a discharging path 15. The discharging path 15 consists of a plurality of discharging lines 15a and 15b, and the discharging lines 15a and 15b are coupled with a control circuit I 6 implemented by a parallel combination of n-channel enhancement type switching transistors Qn14, and the n-channel enhancement type switching transistors Qn14 are responsive to a multi-bit activation signal ACT2 for sequentially coupling the discharging lines 15a and 15b with a ground voltage line GND. A data bit is provided in the form of differential voltage level between the first bit line and the second bit line paired with each other, and the differential voltage level is developed by the associated sense amplifier circuit. Namely, if the discharging lines 15a and 15b are sequentially grounded through the associated n-channel enhancement type switching transistors Qn14, the sense amplifier circuits SA1 and SA2 are activated at interval, and the pairs of n-channel enhancement type amplifying transistors Qn13 vary the respective channel conductances depending upon the voltage level on the associated bit line. Then, the differential voltage levels are increased in magnitude.

The bit line pairs BLP1 and BLP2 are further coupled with pull-up circuits 17a and 17b, and each of the pull-up circuits 17a and 17b elevates one of the first and second bit lines to a predetermined restore level upon application of a pull-up signal P. The bit line pairs BLP1 and BLP2 are terminated at an input and output circuit 18, and the input and output circuit 18 interconnects one of the bit line pairs BLP1 and BLP2 and a data line pair 19 under the control of a column address decoder 20. Namely, the column address decoder 20 decodes column address bits, and instructs the input and output circuit 18 to provide a data path between one of the bit line pairs BLP1 and BLP2 designated by the column address bits and the data line pair 19. The data line pair 19 propagates one of the data bits in the form of differential voltage level to an input/output buffer unit (not shown), and the input/output buffer unit produces an output data signal indicative of the data bit read out from the memory cell designated by the row and column address bits.

Figure 4:
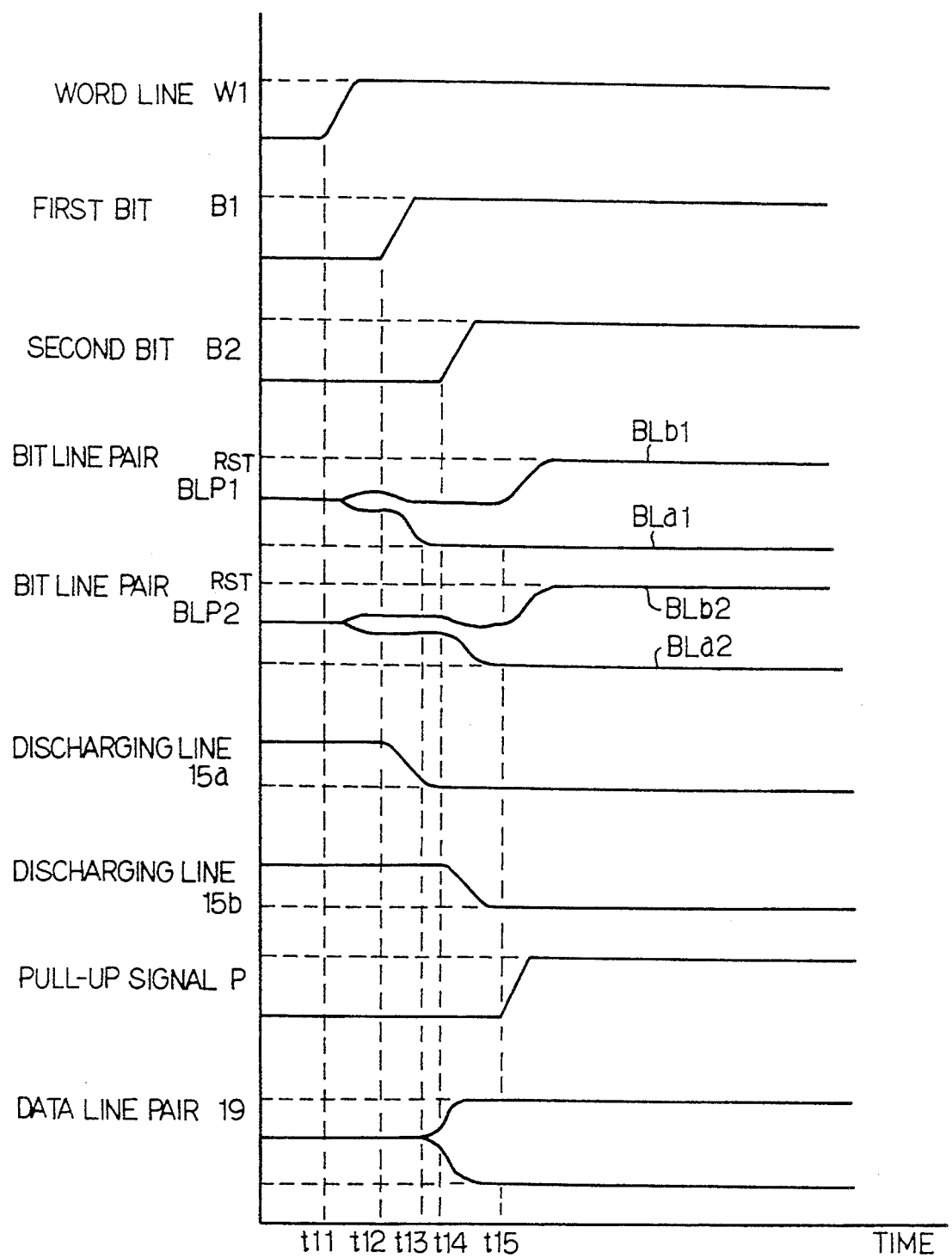
FIG. 4 is a diagram showing the waveforms of essential signals of the dynamic random access memory device shown in FIG. 3.

Description is made on circuit behavior of the dynamic random access memory device implementing the first embodiment with reference to FIG. 4. Assuming now that the a data bit of logic "1" level stored in the memory cell M11 is accessed, the row address bits indicative of the word line W1 are decoded by the row address decoder 13, and the row address decoder 13 drives the selecting signal line X1 to the high voltage level. The selecting signal line X1 allows the associated n-channel enhancement type switching transistor Qn12 to turn on, and the word line W1 is elevated to the active high voltage level in synchronism with elevation of the activation signal line ACT1 at time t11. The n-channel enhancement type switching transistors Qn11 of the memory cells M11 and M12 turn on, and data bits stored in the respective storage capacitors CP11 of the memory cells M11 and M12 are read out to the associated bit line pairs BLP1 and BLP2. Small differential voltage levels take place on the bit line pairs BLP1 and BLP2. Since the data bit of logic "1" level is stored in the memory cell M11, the second bit line BLb1 is slightly lifted, and an intermediate voltage generator (not shown) maintains the first bit line BLa1 in an intermediate voltage level between high and low voltage levels respectively corresponding to the data bit of logic "1" and a data bit of logic "0" level. The memory cell M12 is assumed to also store a data bit of logic "1" level, and the second bit line BLb2 is slightly lifted, allowing the first bit line BLa2 to remain in the intermediate voltage level.

If the multi-bit activation signal ACT2 allows the first bit B1 to go up to the high voltage level at time t12, the associated n-channel enhancement type switching transistor Qn14 turns on so that only the discharging line I 5a is grounded through the associated n-channel enhancement type switching transistor Qn14. Then, only the sense amplifier circuit SA1 is independently activated, and a relatively small amount of current flows from the bit line BLa1 through the sense amplifier circuit SA1 to the discharging line 15a. Thus, the control circuit 16 only drives the discharging line 15a connected with the first bit line BLa1, and, for this reason, the discharging line 15a is rapidly decayed toward the ground voltage level. If the discharging line 15a reaches the ground voltage level at time t13, the column address decoder 20 decodes the column address bits indicative of the bit line pair BLP1, and the input and output circuit 18 couples the bit line pair BLP1 with the data line pair 19. Then, large differential voltage level takes place on the data line pair 19.

As to the other sense amplifier circuit SA2 or the bit line pair BLP2, the multi-bit activation signal ACT2 allows the second bit B2 to go up at time t14, and the other discharging line 15b is grounded through the associated n-channel switching transistor Qn14. Then, the sense amplifier circuit SA2 is activated, and the sense amplifier circuit SA2 discharges the electric charges on the first bit line BLa2 through the associated discharging line 15b to the ground voltage line 15b. The associated n-channel enhancement type switching transistor Qn14 is expected to drive only electric charges accumulated in the first bit line BLa2, and the discharging line 15b and, accordingly, the first bit line BLa2 rapidly reaches the ground voltage level. Since the activation of the bit line pair BLP2 is carried out after the data transfer from the bit line pair BLP1 to the data line pair 19, the access time is never affected by the time interval between times t12 and t14, and the access speed is surely improved.

At time t15, the pull-up signal P goes up to the active high voltage level, and, accordingly, activates the pull-up circuits 17a and 17b. The pull-up circuits 17a and 17b lift the bit lines BLb1 and BLb2 to the predetermined restore voltage level RST. The first bit lines BLb1 and BLb2 propagate the restore voltage level RST to the storage capacitors CP11 of the memory cells M11 and M12, and the data bits of logic "1" level stored in the memory cells M11 and M12 are refreshed.

Second Embodiment

Figure 5:
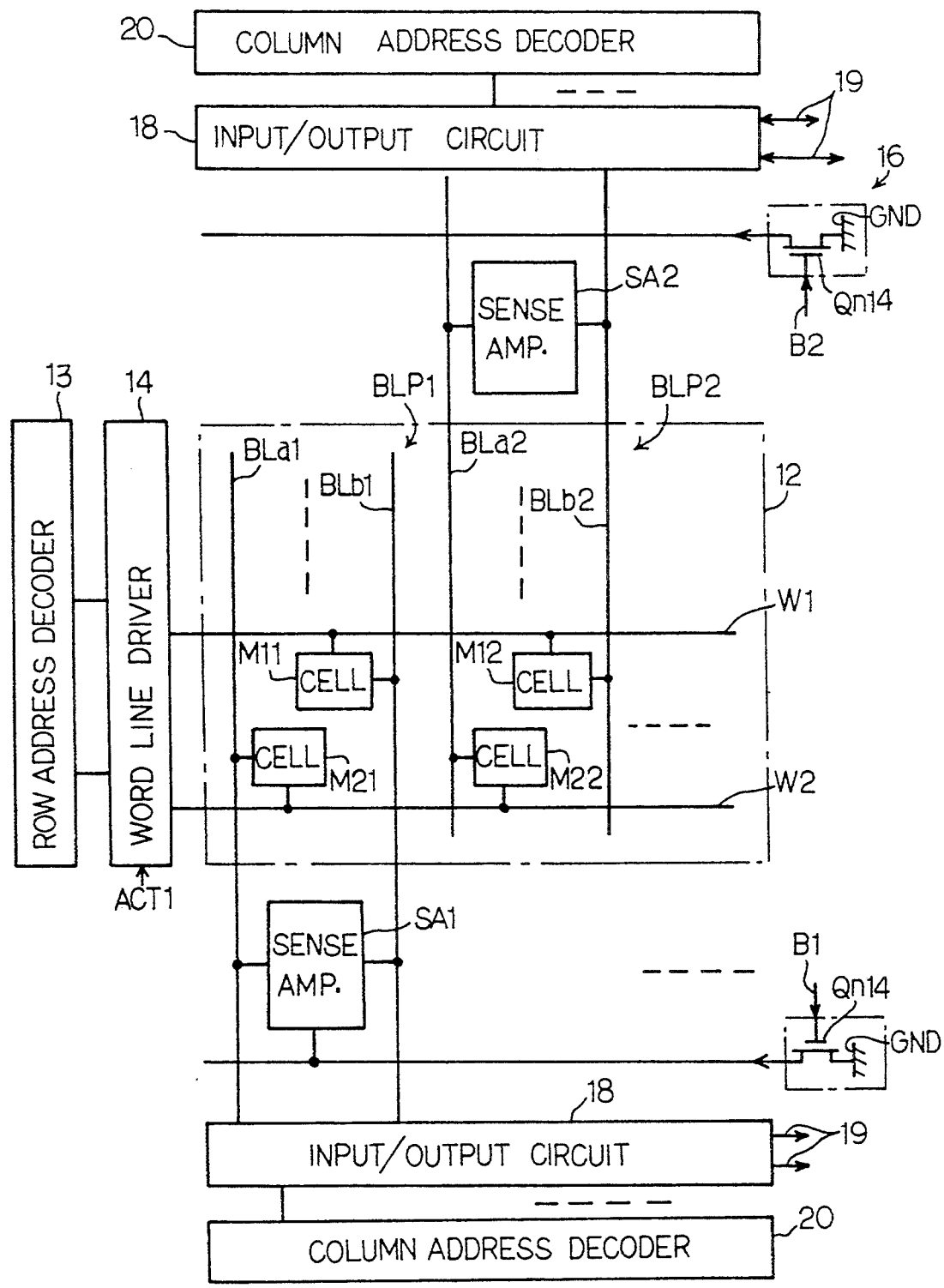
FIG. 5 is a block diagram showing the arrangement of another dynamic random access memory device according to the present invention.

Turning to FIG. 5 of the drawings, another dynamic random access memory device embodying the present invention is illustrated. The dynamic random access memory device shown in FIG. is similar in circuit arrangement to the first embodiment except for the layout thereof, and circuit components of the second embodiment are labeled with the same references designating the corresponding components of the first embodiment without detailed description for the sake of simplicity. In the second embodiment, the sense amplifier circuits SA1 and SA2 are respectively provided on both sides of the memory cell array 12, and two sets of column address decoder/ input and output circuit are provided in association with the sense amplifier circuits SA1 and SA2, respectively. However, the circuit behavior of the second embodiment is similar to that of the first embodiment, and the same advantages are achieved by the second embodiment.

As will be understood from the foregoing description, the sense amplifier circuits are sequentially activated for preventing the activation mean from large amount of current, and, for this reason, the accessed data bit is rapidly developed by the sense amplifier circuit. This results in improvement in access speed.

Although particular embodiments of the present invention have been shown and described, it will be obvious to those skilled in the art that various changes and modifications may be made without departing from the spirit and scope of the present invention. For example, the sense amplifier circuits may have another circuit configuration such as, for example, two series combinations of load elements and amplifying transistors associated with an activation transistor. In the above described embodiments, only two sense amplifier circuits SA1 and SA2 are shown and broken down into two groups. However, it aims at simplification of illustration, and more than two sense amplifier circuits are associated with more than two bit line pairs BLP1 and BLP2 in commercial products. Moreover, the sense amplifier circuits may be broken down into more than two groups respectively associated with individual discharging lines, and only one of the discharging lines associated with the bit line pair indicated by column address bits may be grounded earlier than the other discharging lines.

What is claimed is:

1. A semiconductor memory device comprising:
   a plurality of word lines,
   a pair of first bit lines intersecting said word lines,
   a pair of second bit lines intersecting said word lines,
   a plurality of memory cells each disposed at a different one of intersections of said word lines and said first and second bit lines,
   first selecting means for selecting one of said word lines to cause a first potential difference to appear between said first bit lines and a second potential difference to appear between said second bit lines,
   a first discharging line,
   a second discharging line,
   a first sense amplifier coupled to said first bit lines and said first discharging line, said first sense amplifier being activated when said first discharging line is at a discharging level for amplifying said first potential difference between said first bit lines to produce a first amplified potential difference between said first bit lines,
   a second sense amplifier coupled to said second bit lines and said second discharging line, said second sense amplifier being activated when said second discharging line is at a discharging level for amplifying said second potential difference between said second bit lines to produce a second amplified potential difference between said second bit lines,
   a pair of data lines,
   second selecting means coupled to said first bit lines, said second bit lines and said data lines for selecting one of said first bit lines and said second bit lines to transfer one of said first amplified potential difference and said second amplified potential difference to said data lines, and
   means responsive to a control signal for controlling a level of one of said first and said second discharging lines to a discharging level and thereafter controlling the level of the other of said first and said second discharging lines to the discharging level so that one of said first and said second sense amplifiers is activated first and thereafter the other of said first and said second sense amplifiers is activated, said means responsive to said control signal first causing said first discharging line to be set to the discharging level before said second selecting means selects said first bit lines and causes said second discharging line to be set to the discharging level after said second selecting means selects said first bit lines.

2. A semiconductor memory device as set forth in claim 1, wherein said first selecting means includes a row address decoder and a word line driver, said row address decoder being responsive to row address bits so that said word line driver drives one of said word lines.

3. A semiconductor memory device as set forth in claim 1, wherein said second selecting means includes a first switching transistor connected between said first discharging line and a constant voltage line and a second switching transistor connected between said second discharging line and said constant voltage line, wherein the discharging level of said first discharging line is obtained by turning said first switching transistor ON in accordance with said control signal, and wherein the discharging level of said second discharging line is obtained by turning said second switching transistor ON in accordance with said control signal.

4. A semiconductor memory device comprising:
   a plurality of word lines,
   a plurality of pairs of bit lines each pair intersecting said word lines,
   a plurality of memory cells each disposed at different ones of intersections of said word lines and said bit lines,
   first selecting means for selecting one of said word lines to cause potential differences responsive to memory cells connected to a selected word line to appear between said pairs of bit lines, respectively,
   a plurality of sense amplifiers respectively connected to said pairs of bit lines, each of said sense amplifiers amplifying, when activated, the potential difference between an associated pair of bit lines and producing an amplified potential difference therebetween,
   first activating means responsive to a first control signal for activating first selected ones of said sense amplifiers,
   second activating means responsive to a second control signal for activating second selected ones of said sense amplifiers which are different from said first selected ones of said sense amplifiers,
   a pair of data lines, and
   second selecting means for selecting one of said pairs of bit lines to transfer the amplified potential difference between said one of said pairs of bit lines to said pair of data lines, wherein one of said first, and said second control signals is generated before said second selecting means selects said one of said pairs of bit lines, and wherein the other of said first and said second control signals is generated after said second selecting means selects said one of said pairs of bit lines, a sense amplifier coupled to said one of said pairs of bit lines being thereby activated by said one of said first and said second control signals to produce the amplified potential difference before said second selecting means selects another one of said pairs of bit lines.

* * * * *

UNITED STATES PATENT AND TRADEMARK OFFICE
CERTIFICATE OF CORRECTION

PATENT NO. : 5,416,742
DATED : May 16, 1995
INVENTOR(S) : Masahide Takada

It is certified that error appears in the above-indentified patent and that said Letters Patent is hereby corrected as shown below:

Col. 5, line 3, delete "I6, insert --16-- p. 11, line 2.

Col. 6, lines 8 and 9, delete "I5a", insert --i5a-- p. 14, line 20.

Col. 6, line 58, after "FIG.", insert -- 5-- p. 16, line 20.

Signed and Sealed this

Tenth Day of October, 1995

Attest:

BRUCE LEHMAN

*Attesting Officer*  *Commissioner of Patents and Trademarks*